United States Patent
Catena

(10) Patent No.: US 6,541,537 B1
(45) Date of Patent: Apr. 1, 2003

(54) ACRYLATE POLYMERIC COMPOSITIONS AND METHODS

(75) Inventor: Daniel W. Catena, Greer, SC (US)

(73) Assignee: Renaissance Technology LLC, Greer, SC (US)

( * ) Notice: Subject to any disclaimer, the term of this patent is extended or adjusted under 35 U.S.C. 154(b) by 51 days.

(21) Appl. No.: 09/766,096

(22) Filed: Jan. 19, 2001

(51) Int. Cl.[7] .................................................. C08F 2/46
(52) U.S. Cl. ...................... 522/150; 522/151; 522/152; 522/153; 522/154; 522/155; 522/156; 526/245; 526/273; 526/317.1; 526/318.2; 526/318.4; 526/328; 526/328.5; 526/329; 526/329.1; 526/329.2
(58) Field of Search .............................. 522/25, 31, 99, 522/100, 102, 103, 129, 146, 150, 151, 152, 153, 154, 155, 156, 149; 526/245, 273, 318.2, 318.4, 318.41, 318.45, 321, 323.1, 328, 328.5, 329, 329.1, 329.2, 329.4, 329.6

(56) References Cited

U.S. PATENT DOCUMENTS

| | | |
|---|---|---|
| 3,974,303 A | 8/1976 | Iwase et al. |
| 4,898,656 A | 2/1990 | Hoshino et al. |
| 5,102,775 A | 4/1992 | Okuhara et al. |
| 5,468,784 A | 11/1995 | Yanagawa et al. |
| 5,484,850 A | 1/1996 | Kempter et al. |
| 5,558,911 A | 9/1996 | Blum |
| 5,607,730 A | 3/1997 | Ranalli |
| 5,639,560 A | 6/1997 | Moens et al. |
| 5,789,039 A | 8/1998 | Biller et al. |
| 5,804,311 A * | 9/1998 | Suwa et al. .................. 385/145 |
| 5,824,373 A | 10/1998 | Biller et al. |
| 5,827,608 A | 10/1998 | Rinehart et al. |
| 5,877,231 A | 3/1999 | Biller et al. |
| 5,922,473 A * | 7/1999 | Muthiah et al. ............ 427/180 |
| 5,935,661 A | 8/1999 | Biller et al. |
| 6,005,017 A | 12/1999 | Daly et al. |
| 6,106,905 A | 8/2000 | Blum et al. |

OTHER PUBLICATIONS

G.P.A. Turner, Introduction to Paint Chemistry and Principles of Paint Technology, pp. 206–219, 1980, London New York Chapman and Hall.

Surface Coatings Raw Materials and Their Usage, pp. 297–298, vol. 1, No date.

* cited by examiner

*Primary Examiner*—Susan W. Berman
(74) *Attorney, Agent, or Firm*—Dority & Manning, P.A.

(57) ABSTRACT

A compound and a method of forming a photopolymerizable acrylated glycidyl acrylic terpolymer resin compound is disclosed. The polymeric resin may be formed in a two-step process. A photopolymerizable acrylic hybrid polymer is suitable for forming films having glass transition temperatures from about –55 degrees C. to about 110 degrees C. A non-aromatic photopolymerizable acrylate polymer may be formed by combining, in a first step, a reactive source of epoxide ion groups. In a second step, the glycidyl acrylic terpolymer formed in the first step is reacted with a catalyst and a source of unsaturated acid or anhydride to form an acrylate polymer. A ring opening reaction is employed such that an acid or an anhydride containing a conjugated double bond forms an acrylated acrylic, an acrylated fluorinated acrylic, an acrylated silonted acrylic, or an acrylated halogenated grafted acrylic. The cure process is initiated with specific UV or visible light promotors and/or with a UV or visible light source. Sometimes, an electron beam source can be used for curing, including cationic promoters or peroxide initiators.

32 Claims, No Drawings

ACRYLATE POLYMERIC COMPOSITIONS AND METHODS

FIELD OF THE INVENTION

The invention is directed to a compound and a method of forming a photopolymerizable acrylated glycidyl acrylic terpolymer resin compound.

BACKGROUND OF THE INVENTION

Acrylate polymers may be used as pressure sensitive adhesives, coatings, and surface application materials for numerous products. For example, acrylic polymers are used to coat the surfaces of printing plates, door jambs, and many other items which require a hard weather resistant coating. Such coatings have many applications for surfaces of items that are particularly heat sensitive such as paper, plastics, and wood.

Many acrylate resin coatings are cured using ultraviolet light. Such coatings may be cured by the impact of ultraviolet light upon the surface of the coating, which results in curing of the composition. In other applications, such compounds may be cured by a cationic curing process.

Radiation curing involves the use of ultraviolet light as a cause of free radical formation. For example, polyester clear coatings which are stored in untinted glass bottles may polymerize in a few days or weeks. In some cases, hardening of such a coating may be achieved by only a few seconds of exposure to ultraviolet light, because of the very efficient conversion of ultraviolet light energy to free radicals.

In general, acrylate resins comprise a class of thermoplastic or thermoset polymers or copolymers. These oligomers polymerize readily in the presence of light, heat or catalysts. In general, acrylate resins must be stored or shipped with inhibitors present in the composition to avoid spontaneous and explosive polymerization. Acrylate resins vary in physical properties from very hard brittle solids to fibrous elastomeric structures to viscous liquids, depending upon the monomer used and the method of polymerization employed.

In some cases, acrylate resins are "bulk" polymerized. For example, in U.S. Pat. No. 3,974,303 to Iwase et al., (see Example #4, column 5, lines 20–42) a method of forming a coating film using "bulk" polymerization is disclosed. In this patent, a method for forming coating films is disclosed which is stated to provide a coating film having impact resistance, adhesion to a substrate article, flexibility and chemical resistance. The method includes a coating having a powdery composition. In the patent a curing agent, a pigment and other additives are provided into a powdery resin. The resin is applied to an article to be coated using electrostatic coating or fluidized bed coating. Then, the coating is heated to a relatively high temperature to effect melting and curing simultaneously. One disadvantage of the process disclosed in U.S. Pat. No. 3,974,303 is that the process typically shows an excess of acrylic acid in the final product. In most cases, that results because the goal in that process is to react all of the epoxide groups. However, under such conditions, there often is no epoxy remaining for a cationic curing process. Therefore, overall curing is limited in such a process because without a light or UV source, curing will undesirably cease.

One significant problem encountered in employing the teachings of the prior art is the fact that many such coatings are not capable of providing both good weathering characteristics and a fast cure speed. Epoxy acrylates are relatively fast curing, but are hard and brittle when cured, and therefore do not weather well due to either the aromatic ring structure or the weak backbone of the aliphatic compounds. Urethane acrylates and polyester acrylates both suffer these problems. For example, polyester acrylates, which comprise a polyester backbone, transesterify upon long term exposure, and the film therefore decomposes after a certain amount of time. Such compounds also are susceptible to degradation from moisture. In general, this class of products cures slower than other types of products.

Another significant problem occurs if the radiation source, during curing, does not hit all of the surface of a coated substrate. Currently known compositions leave the surface of the coated article uncured and tacky in most instances, which is highly undesirable.

What is needed in the industry is an acrylate resin composition and method of forming an acrylate resin composition that produces a resin having desirable physical characteristics. Furthermore, an acrylate resin that is capable of being effectively cured to a hard finish both by radiation curing (i.e., ultraviolet light or visible light) and also by cationic polymerization would be very useful. In general, acrylate resin compositions showing an increased resistance to yellowing and discoloration are very desirable. Compositions which exhibit a relatively low polydispersity value and a low glass transition temperature also are desirable. Furthermore, acrylate resins that are stable at higher temperatures are useful.

SUMMARY OF THE INVENTION

A non-aromatic photopolymerizable acrylate polymer is provided in the invention. In a first step, the polymer may be formed by polymerizing a reactive source of epoxide ions, a source of unsaturated monomers in the presence of a catalyst to form a glycidyl acrylic terpolymer. Then in a second step, the glycidyl acrylic terpolymer is reacted with an epoxy ring opening catalyst and a source of unsaturated acid or anhydride to form the acrylate polymer of the invention. The polymer is formed using a minimum molar amount of acid such that epoxide groups are left upon the polymer backbone (not completely reacted via the second stage carboxy ring opening reaction) and remaining epoxide groups are rendered reactive during polymerization, so that the epoxide groups are available to react cationically.

In another aspect of the invention, the polymer is capable of being cured cationically. The polymer may include many different kinds of unsaturated monomer, and is selected from the group consisting of: methyl methacrylate, butyl acrylate, hydroxyethylacrylate, methyl acrylate, ethyl acrylate, isopropyl acrylate, n-butyl acrylate, s-butyl acrylate, t-butyl acrylate, 2-ethylhexyl acrylate, cyclohexyl acrylate, 3,3,5-trimethycyclohexyl acrylate, 2-methoxyethyl acrylate, 2-ethoxyethyl acrylate, 2-butoxyethyl acrylate, acrylonitrile, methyl methacrylate, ethyl methacrylate, isopropyl methacrylate, n-butyl methacrylate, s-butyl methacrylate, t-butyl methacrylate, n-hexyl methacrylate, n-octyl methacrylate, lauryl methacrylate, tridecyl methacrylate, stearyl methacrylate, phenyl methacrylate, cyclohexyl methacrylate, 3,3,5-trimethylcyclohexyl methacrylate, isobornyl methacrylate, bromoethyl methacrylate, 2-hydroxyethyl methacrylate, hydroxypropyl methacrylate, glycidyl methacrylate, methoxyethyl methacrylate, ethoxyethyl methacrylate, diethyl methyleneglutarate, isocyanatoethyl methacrylate, methacrylic acid, methacrylonitrile, 2-(diethylphosphato)ethyl methacrylate, 1-diethylphosphonoethyl methacrylate, ethylene, butadiene, vinylidene chloride, and n-vinylpyrrolidinone.

In one embodiment of the invention, the polymer is capable of polymerizing by: (1) photopolymerization, (2) cationic polymerization, or both photopolymerization and cationic polymerization.

The catalyst employed in the first step may be a peroctoate or any other free radical initiator with a 30-minute half-life at less than 120° C. In the second step of reaction, the catalyst may be a phosphonium or onium salt compound, such as ethyl triphenyl phosphonium bromide, for example.

In one embodiment of the invention, a method is provided that includes forming a photopolymerizable acrylated glycidyl acrylic terpolymer resin in a two-step reaction. First, the method includes providing a source of epoxide ions having an epoxide ring structure, and providing a source of unsaturated monomer. A catalyst is also provided. In the first step, the reactants form a terpolymer chain having epoxide groups along the length of the terpolymer chain. Then, in a second step, the terpolymer chain reacts with acrylic acid, thereby opening the rings of epoxide groups along the terpolymer chain and forming a photopolymerizable acrylated glycidyl acrylic terpolymer resin.

DETAILED DESCRIPTION OF THE INVENTION

Reference now will be made to the embodiments of the invention, one or more examples of which are set forth below. Each example is provided by way of explanation of the invention, not as a limitation of the invention. In fact, it will be apparent to those skilled in the art that various modifications and variations can be made in this invention without departing from the scope or spirit of the invention. For instance, features illustrated or described as part of one embodiment can be used on another embodiment to yield a still further embodiment. Thus, it is intended that the present invention cover such modifications and variations as come within the scope of the appended claims and their equivalents. Other objects, features and aspects of the present invention are disclosed in or are obvious from the following detailed description. It is to be understood by one of ordinary skill in the art that the present discussion is a description of exemplary embodiments only, and is not intended as limiting the broader aspects of the present invention, which broader aspects are embodied in the exemplary constructions.

In general, the invention of this application comprises photopolymerizable acrylate hybrid polymers suitable for forming films with glass transition temperatures (i.e., $T_g$'s) from –55° C. to 110° C. that may be used in liquid and powder coatings, inks, adhesives and composites.

The copolymer composition, in one embodiment of the invention, comprises a resinous material which is a terpolymer or copolymer of alkyl (meth)acrylate and fluoroalkyl (meth)acrylate. Sometimes, the composition may be provided as a silanealkyl(meth)acrylate or a fluoroolefin, chloroolefin, and an unsaturated source of reactive epoxide ions. The compound in this particular embodiment is modified through the ring opening reaction with an acid and/or anhydride containing a conjugated double bond to form an acrylated acrylic, an acrylated fluorinated acrylic, an acrylated halogenated grafted acrylic or an acrylated silanated acrylic having side chain unsaturation and reactive glycidyl groups. The compounds may be cured with ultraviolet light. Curing is initiated with specific UV and/or Visible Light promoters with an UV and/or Visible Light source or without UV or visible light promoters with an electron beam source. Sometimes, cationic promoters or peroxide initiators may be employed in the composition.

In the process of the invention, it is possible to provide, in a two-step reaction process, an acrylic polymer resin. Typically, no aromatic monomers are included in the reaction mixture. That is, the invention comprises, in one embodiment, an unsaturated polyacrylate and a polymethacrylate combined in the reaction mixture.

Another known method for forming coating films, employs ionizing radiation or ultraviolet rays which are applied to a coated film and a resin having polymerizable unsaturated groups to cause a chemical polymerization reaction and effect curing. Most paints used in this method are formed by dissolving a resin having polymerizable double bonds into a polymerizable monomer and a photoinitiator.

In the method of the invention, a terpolymer is first formed having a long chain with epoxide groups along the length of the chain. Then, in a second reaction step, a clear photopolymerizable acrylated hybrid glycidyl acrylic terpolymer resin is formed having a $T_g$ of less than about 50° C., and preferably less than about 0° C. In a preferred embodiment, the glass transition temperature ($T_g$) is about –30° C. The curing of polymers pursuant to the invention may be by ultraviolet radiation or electron beam radiation. Furthermore, free radical polymerization may be employed to cure the polymers of the invention. In one application, an epoxy cationic cure is used. Some compositions of the invention are curable by one or more of the above methods, that is, a combination of two or more curing methods. Such compositions are sometimes known as "dual" curing compositions.

A terpolymer formed according to the invention may sometimes contain alternating groups of glycidyl methacrylate ("GMA") and acrylic acid ("AA") in alternating sequence along the chain of the polymer. In some cases, the pattern could be 3:1 GMA groups to AA, but a preferred ratio is about 1:1. That is, there may be a GMA group, followed by an AA group, followed by a GMA group, followed by AA, etc. Catalysts are used to initiate the reaction.

In general, the UV curing process requires a UV lamp that directs UV light onto the formulated product. Photoinitiators absorb the UV energy from the light source, causing a chemical reaction that quickly converts the liquid into a solid, cured film.

The bulk of the formulation to be cured contains monomers and oligomers. Monomers such as multi-functional acrylate monomers are low molecular weight materiasl. They may be monofunctional, bifunctional, or multifunctional molecules. These molecules become part of the polymer matrix in the cured coating because of their reactive functional groups. Furthermore, monomers functions as diluents in such formulations. Monomers are sometimes referred to as reactive diluents.

Oligomers, on the other hand, are high molecular weight viscous materials. The molecular weight of oligomers ranges from several hundred to several thousand or even higher. Usually the type of oligomer backbone determines the final properties of the coating. Properties of the coating that are important include flexibility, toughness, and others. Backbones can be polyether, polyester, polyurethane or others. The functional groups that provide the linkage between molecules are usually located at both ends of the oligomer molecules. A common functionality used is the acrylate functional group.

The photoinitiator in the application of the invention is a critical component of the UV curing process. The additive initiates the polymerization process to quickly reach the final crosslinked product. As UV light energy is emitted, it is absorbed by the photoinitiator in the liquid, causing it to fragment into reactive species. These species may be either free radical or cationic. The majority of systems are based upon free radicals that react with the unsaturated compounds in the liquid, causing them to polymerize. This type of reaction is almost instantaneous.

Of equal importance to the photoinitiator, however, is the UV light source. Basically, two types of light sources are available: arc light and laser light. Arc light includes medium pressure mercury lamps and the high pressure xenon lamps, as but one example. However, any source of UV light may be used, including natural sources.

Free radical initiators can be described as either "hydrogen abstraction type" or "alpha cleavage type." While hydrogen abstraction initiators have their specific uses, especially in three or four-way.

Epoxide ions that can be used in the practice of the invention include: glycidyl methacrylate or glycidyl acrylate, as examples. photoinitiator blends, alpha cleavage initiators are the most widely used. The alpha cleavage initiators have a generally higher efficiency due to their generation of free radicals by way of a unimolecular process. Alpha cleavage initiators need only to absorb light in order to generate radicals. Hydrogen abstraction initiators, on the other hand, require an extra step. That is, after absorbing light, the excited state photoinitiator must find a hydrogen donating source in order to generate the free radicals. Thus, it is a bimolecular process.

Furthermore, the source of unsaturated monomer, acid or anhydride monomer could include, for example, acrylic acid, methacrylic acid, itaconic acid, maleic anhydride, or fumaric acid, to name but a few examples. The remainder of the composition could be made up of methyl acrylate or ethyl acrylate, butyl acrylate, ethylhexyl acrylate, lauryl acrylate, stearyl acrylate, and also methacrylate versions of the above listed compounds. Furthermore, hydroxyethyl acrylate, hydroxyethyl methacrylate, hydroxypropyl acrylate, and hydroxypropyl methacrylate could be used as co-monomers in the invention.

In some applications of the invention it may be advantageous to use isobutyl methacrylate, isobutyl acrylate, isodecyl methacrylate, or isodecyl acrylate or other derivatives of these compounds. The monomers discussed above can be used to adjust the $T_g$ of the resulting product.

The polymer also may be obtained by using a free radical catalyst having a half life less than about 30 minutes @120 degrees C.

Additionally, the following compounds could be used in the practice of the invention: methyl acrylate, ethyl acrylate, isopropyl acrylate, n-butyl acrylate, s-butyl acrylate, t-butyl acrylate, 2-ethylhexyl acrylate, cyclohexyl acrylate, 3,3,5-trimethycyclohexyl acrylate, 2-methoxyethyl acrylate, 2-ethoxyethyl acrylate, 2-butoxyethyl acrylate, acrylic acid, acrylonitrile, methyl methacrylate, ethyl methacrylate, isopropyl methacrylate, n-butyl methacrylate, s-butyl methacrylate, t-butyl methacrylate, n-hexyl methacrylate, n-octyl methacrylate, lauryl methacrylate, tridecyl methacrylate, stearyl methacrylate, phenyl methacrylate, cyclohexyl methacrylate, 3,3,5-trimethylcyclohexyl methacrylate, isobornyl methacrylate, bromoethyl methacrylate, 2-hydroxyethyl methacrylate, hydroxypropyl methacrylate, glycidyl methacrylate, methoxyethyl methacrylate, ethoxyethyl methacrylate, diethyl methyleneglutarate, isocyanatoethyl methacrylate, methacrylic acid, methacrylonitrile, 2-(diethylphosphato)ethyl methacrylate, 1-diethylphosphonoethyl methacrylate, styrene, ethylene, butadiene, vinylidene chloride, n-vinylpyrrolidinone. Most of the above polymers may be obtained from the Rohm and Haas Company, of Philadelphia, Pa.

In general, the polydispersity of the glycidyl acrylic terpolymers formed is usually less than about 2. Polydispersity represents the molecular weight average divided by the molecular number average.

In the application of the invention, the catalyst used could be essentially any catalyst which has, at 120° C., less than about 30 minutes of half life. For example, diacyl peroxides, monoperoxy carbonic acid esters, peroxydicarbonates, alkyl peresters, ketone peroxides, alkyl hydroperoxides, inorganic peroxides, and others could be used. Many of these compounds may be obtained from Laporte Organics, including Aztec Peroxides, Inc. formerly of Houston, Tex. Furthermore, polymerization initiators including VAZO® brand polymerization initiators distributed by the DuPont Company of Wilmington, Del. may be employed ("VAZO" is believed to be a trademark of the DuPont Chemical Company).

The polymer of the invention also may be formed formed using a molar amount of monomer to facilitate a ring opening reaction that consumes between about 25 and 75 percent of the reactive source of epoxide ion groups, the epoxide ions groups being rendered reactive during photopolymerization.

EXAMPLE 1

Toluene (1919 g) was charged into a 5 liter reactor equipped with a stirrer, a thermocouple, a reflux condenser/decanter setup, a nitrogen inlet valve and an oxygen sparge inlet valve. The toluene was heated to 115° C. below its reflux point under a nitrogen blanket. A premix of 400 g of glycidyl methacrylate, 308 g methyl methacrylate and 1099 g butyl acrylate was made. The premix was added continually and concurrently with 54 g tertiary butyl peroctoate over a 240 minute period by using a twin head-metering pump while maintaining a temperature of 115° C. below the reflux point of the mixture. After the addition was completed two additional adds of 14 g tertiary butyl peroctoate were made at 90 minute intervals. A polymer (glycidyl acrylic terpolymer) solution was formed.

The resulting polymer has a solids content of about 47.5%. Vacuum is applied to the reactor and the toluene is removed as the reactor is heated to 130 degrees C. Vacuum is maintained until 99% min. solids content is achieved. The reactor is now sparged with a 5.5% oxygen/94.5% nitrogen mixture, while maintaining a nitrogen blanket. 1.6 g phenothiazine and 2.0 g ethyl triphenyl phosphonium bromide were added to the reactor and allowed to mix for about 15 minutes. A premix of 102 g acrylic acid and 2.0 g methylethyl hydroquinone (MEHQ) were added to the reactor over a 120-minute period while maintaining a minimum temperature of 130 degrees C. The batch was held for an acid number of 2.0. Then, 1.0 g methylethyl hydroquinone was added to the batch. The resulting polymer provided a clear photopolymerizable acrylated hybrid glycidyl acrylic terpolymer resin with a $T_g$ of about −30 degrees C.

The acrylic acid reacts with the epoxide group of the glycidyl methacrylate. Any copolymerization with the polymer or homopolymerization of the acrylic acid may tend to cause insolubility, instability, or inability to cure by ultraviolet (UV) or electron beam light sources.

In other examples, phosphonium halides in general could be used as the catalyst, such as for example ethyl triphenyl phosphonium iodide.

EXAMPLE 2

The same reactants and conditions are provided as in EXAMPLE 1, but all or part of the butyl acrylate and methyl methacrylate is replaced with fluoroalkylacrylate or flouroalkylrnethacrylate, or mixtures thereof.

In the initial step, fluorinated glycidyl acrylic terpolymer is formed. After the final reaction, a photopolymerizable acrylated hybrid fluorinated glycidyl acrylic terpolymer is formed.

EXAMPLE 3

In this example, 1919 g of isobutyl acetate were charged into a 5 liter reactor equipped with a stirrer, a thermocouple, a reflux/decanter setup, a nitrogen inlet valve and an oxygen sparge inlet valve. Heat is applied to 115° C. below its reflux point under a nitrogen blanket. A premix of 571 g glycidyl methacrylate, 308 g methyl methacrylate, 871 g butyl acrylate and 116 g hydroxyethyl acrylate was made. The premix was added continually and concurrently with 55 g tertiary butyl peroctoate over a 240 minute period by use of a twin head-metering pump while maintaining a temperature of 115° C. below the reflux point of the mixture. After the addition was completed, two additional adds of 14 g tertiary butyl peroctoate were made at 90 minute intervals. A polymer (glycidyl acrylic terpolymer) solution was formed.

The resulting polymer has a solids content of about 47.5%. Additionally, 660 g of a hydroxyl functional phenyl polysiloxane (with a combining weight of 400) and 3.0 g tetraisopropyltitanate was added to the polymer solution. The reactor was heated to 130° C. At 120° C., the etherification reaction began, and the water of reaction was removed by the azeotrope and collected in the decanter. The temperature of 130° C. was maintained until the 30 g were collected and the solution polymer was clear. A polymer (polysiloxane glycidyl acrylic terpolymer) was formed.

Vacuum was applied to the reactor, and the remaining isobutyl acetate was removed from the reactor while maintaining a temperature of 130 degrees C. Vacuum was maintained until about 99% minimum solids content was achieved. The reactor was then sparged with a 5.5% oxygen/ 94.5% nitrogen mixture, while maintaining a nitrogen blanket. Then, 1.6 g phenothiazine and 2.0 g ethyl triphenyl phosphonium bromide were added to the reactor and allowed to mix for 15 minutes. A premix of 102 g acrylic acid and 2.0 g methylethyl hydroquinone were added to the reactor over a 120-minute period while maintaining a minimum temperature of 130 degrees C. The batch was held for an acid value of 2.0. Then, 1.0 g of methylethyl hydroquinone was added to the batch. The resulting polymer was a clear photopolymerizable acrylated hybrid polysiloxane glycidyl acrylic terpolymer resin.

EXAMPLE 4

In this Example, 310 g of toluene, 240 g butyl acrylate and 200 g chlorinated polypropylene 30% solution in toluene was charged into a 5 liter reactor equipped with a stirrer, a thermocouple, a reflux condenser/decanter setup, a nitrogen inlet valve and an oxygen sparge inlet valve. The solution was heated to 40° C. under a nitrogen blanket. At 40° C., 1.8 g tertiary butyl peroctoate was added and the batch was slowly heated to a temperature of 118–120° C. by azeotrope reflux. When the reflux subsided the graft chlorinated polyolefin acrylic copolymer was formed. About 1467 g of isobutyl acetate was added to the reactor and the batch was reheated to 115° C. below its reflux point maintaining a nitrogen blanket. A premix of 400 g of glycidyl methacrylate, 508 g methyl methacrylate, 300 g butyl acrylate and 300 g styrene was made. This premix was added continually and concurrently with 54 g tertiary butyl peroctoate over a 240 minute period by use of a twin head-metering pump while maintaining a temperature of 115° C. below the reflux point of the mixture. After the addition was completed, two additional adds of 14 g tertiary butyl peroctoate were made at 90 minute intervals. A polymer (graft chlorinated polyolefin glycidyl acrylic terpolymer) solution was formed.

The resulting polymer had a solids content of about 47.5%. Vacuum was applied to the reactor and the toluene was removed as the reactor was heated to 130 degrees C. Vacuum was maintained until 99% min. solids content is achieved. The reactor was now sparged with a 5.5% oxygen/ 94.5% nitrogen mixture, while maintaining a nitrogen blanket. Then, 1.6 g phenothiazine and 2.0 g ethyl triphenyl phosphonium bromide were added to the reactor and allowed to mix for about 15 minutes. A premix of 102 g acrylic acid and 2.0 g methylethyl hydroquinone (MEHQ) was added to the reactor over a 120 minute period maintaining a minimum temperature of 130 degrees C. The batch was held for an acid number of 2.0. Then, 1.0 g methylethyl hydroquinone was added to the batch. The resulting polymer was a clear photopolymerizable acrylated hybrid graft chlorinated polyolefin glycidyl acrylic terpolymer resin with a $T_g$ of about 55 degrees C.

The acrylic acid is reacted with the epoxide group of the glycidyl methacrylate, and any copolymerization with the polymer or homopolymerization of the acrylic acid was avoided.

EXAMPLE 5

The same reactants and conditions of Example 1 were used, but all or part of the butyl acrylate and methyl methacrylate was replaced with fluoroalkylacrylate or fluoroalkylmethacrylate (or a mixture thereof).

In the initial step a graft chlorinated polyolefin acrylic copolymer was formed. In the second stage a graft chlorinated polyolefin fluorinated glycidyl acrylic terpolymer was formed. After the final reaction, a photopolymerizable acrylated hybrid graft chlorinated polyolefin fluorinated glycidyl acrylic terpolymer was formed.

EXAMPLE 6

In this Example, 310 g of toluene, 240 g butyl acrylate and 200 g chlorinated polypropylene 30% solution in toluene are charged into a 5 liter reactor equipped with a stirrer, a thermocouple, a reflux/decanter setup, a nitrogen inlet valve and an oxygen sparge inlet valve and heated to 40° C. under a nitrogen blanket. At about 40° C., 1.8 g tertiary butyl peroctoate was added and the batch was slowly heated to exotherm and a temperature of 118–120° C. was maintained by azeotropic reflux. When the reflux subsided the graft chlorinated polyolefin copolymer was formed. Then, 1467 g of toluene was added to the reactor and the batch was reheated to about 115° C. below its reflux point while maintaining a nitrogen blanket. A premix of 571 g glycidyl methacrylate, 508 g methyl methacrylate, 121 g butyl acrylate, 116 g hydroxyethyl acrylate and 300 g styrene was made. This premix was added continually and concurrently with 55 g tertiary butyl peroctoate over a 240 minute period by use of a twin head-metering pump while maintaining a temperature of 115° C. below the reflux point of the mixture. After the addition was completed, two additional adds of 14 g tertiary butyl peroctoate were made at 90 minute intervals. A polymer (graft chlorinated polyolefin glycidyl acrylic terpolymer) solution was formed.

The resulting polymer had a solid content of about 47.5%. Further, about 660 g of a hydroxyl functional phenyl polysiloxane (with a combining weight of 400) and 3.0 g tetraisopropyltitanate were added to the polymer solution. The reactor was heated to 130° C. At 120° C. the etherification reaction began, and the water of reaction was removed by the azeotrope and collected in a decanter. The temperature of 130° C. was maintained until the 30 g were collected and the solution polymer was clear. A polymer (polysiloxane glycidyl acrylic terpolymer) was formed.

Vacuum was applied to the reactor and the remaining toluene was removed from the reactor while maintaining a temperature of about 130 degrees C. Vacuum was maintained until 99% minimum solids content was achieved. The reactor was sparged with a 5.5% oxygen/94.5% nitrogen mixture, while maintaining a nitrogen blanket. About 1.6 g phenothiazine and 2.0 g ethyl triphenyl phosphonium bromide were added to the reactor and allowed to mix for 15 minutes. A premix of 102 g acrylic acid and 2.0 g methylethyl hydroquinone was added to the reactor over a 120 minute period, while maintaining a minimum temperature of 130 degrees C. The batch was held for an acid value of 2.0. Then, 1.0 g of methylethyl hydroquinone are added to the batch. The resulting polymer was a clear photopolymerizable acrylated hybrid graft chlorinated polyolefin polysiloxane glycidyl acrylic terpolymer resin.

It is understood by one of ordinary skill in the art that the present discussion is a description of exemplary embodiments only, and is not intended as limiting the broader aspects of the present invention, which broader aspects are embodied in the exemplary constructions. The invention is shown by example in the appended claims.

What is claimed is:

1. A photopolymerizable ethylenically unsaturated copolymer formed by a reaction process comprising:
   (a) providing an epoxide-containing acrylate monomer, said epoxide-containing acrylate monomer having at least one epoxide group;
   (b) providing an ethylenically unsaturated monomer,
   (c) reacting (a) with (b), thereby forming an epoxide-containing acrylic copolymer chain, the epoxide-containing acrylic copolymer chain having epoxide groups positioned along said chain;
   (d) providing less than a molar excess of a donor compound, the donor compound being selected from the group consisting of: ethylenically unsaturated acids and anhydrides;
   (e) providing a ring-opening catalyst;
   (f) reacting less than a molar excess of said donor compound in the presence of said ring-opening catalyst, with epoxide groups of the epoxide-containing acrylic copolymer chain, said molar amount of said donor compound consuming between about 25 and about 75 percent of said epoxide groups in said epoxide-containing acrylic copolymer chain;
   (g) thereby forming an ethylenically unsaturated glycidyl acrylic copolymer having reactive epoxide groups, said reactive epoxide groups being capable of undergoing a subsequent cationic reaction.

2. The ethylenically unsaturated glycidyl acrylic copolymer of claim 1 in which said non-aromatic acrylate monomer is selected from the group consisting of:
   methyl methacrylate, butyl acrylate, hydroxyethylacrylate, methyl acrylate, ethyl acrylate, isopropyl acrylate, n-butyl acrylate, s-butyl acrylate, t-butyl acrylate, 2-ethylhexyl acrylate, cyclohexyl acrylate, 3,3,5-trimethycyclohexyl acrylate, 2-methoxyethyl acrylate, 2-ethoxyethyl acrylate, 2-butoxyethyl acrylate, acrylonitrile, methyl methacrylate, ethyl methacrylate, isopropyl methacrylate, n-butyl methacrylate, s-butyl methacrylate, t-butyl methacrylate, n-hexyl methacrylate, n-octyl methacrylate, lauryl methacrylate, tridecyl methacrylate, stearyl methacrylate, phenyl methacrylate, cyclohexyl methacrylate, 3,3,5-trimethylcyclohexyl methacrylate, isobornyl methacrylate, bromoethyl methacrylate, 2-hydroxyethyl methacrylate, hydroxypropyl methacrylate, methoxyethyl methacrylate, ethoxyethyl methacrylate, diethyl methyleneglutarate, isocyanatoethyl methacrylate, methacrylonitrile, 2-(diethylphosphato)ethyl methacrylate, 1-diethylphosphonoethyl methacrylate, ethylene, butadiene, vinylidene chloride, acrylic acid, methacrylic acid, itaconic acid, fumaric acid, and n-vinylpyrrolidinone.

3. The copolymer of claim 1 in which the copolymer is capable of curing by:
   (1) photopolymerization,
   (2) cationic polymerization, or
   (3) both photopolymerization and cationic polymerization.

4. The copolymer of claim 1 in which step (c) employs a free radical polymerization catalyst having a half life less than about 30 minutes @ about 120 degrees C.

5. The copolymer of claim 4 in which the ring-opening catalyst employed in step (e) comprises a compound selected from the group of compounds consisting of: phosphonium compounds and onium compounds.

6. The copolymer of claim 1, wherein the copolymer is cationically cured by:
   (h) providing a photoinitiator,
   (i) exposing said copolymer to ultraviolet light, and
   (j) cationically curing said copolymer by reaction of said epoxide groups.

7. The copolymer of claim 1 in which the epoxide-containing acrylate monomer employed in step (a) comprises glycidyl methacrylate.

8. The copolymer of claim 7 in which said non-aromatic acrylate monomer and said glycidyl methacrylate are linked in a copolymeric chain.

9. The polymer of claim 1 in which the glass transition temperature of the polymer is from about −55 degrees C. to about 110 degrees C.

10. The copolymer of claim 1 in which the copolymer is capable of curing cationically and providing adhesion to metal substrates without adding heat.

11. The copolymer of claim 1 in which the nonaromatic acrylate monomer comprises a fluoroalkylacrylate or fluoroalkyl methacrylate.

12. The copolymer of claim 1 in which a co-reaction is employed with a compound selected from the group consisting of: hydroxy silanes, methoxy silanes and ethoxy silanes.

13. The polymer of claim 1 wherein a halogenated olefin is reacted to form a graft polyolefin glycidyl acrylic copolymer.

14. A method of forming a photopolymerizable ethylenically unsaturated copolymer, the method comprising:
(a) providing an epoxide-containing ethylenically unsaturated monomer,
(b) providing an ethylenically unsaturated monomer,
(c) reacting (a) with (b), thereby forming an epoxide-containing copolymer chain, said epoxide-containing copolymer chain having epoxide groups positioned along said chain;
(d) providing a donor compound, said donor compound being selected from the group consisting of: ethylenically unsaturated acids and anhydrides;
(e) providing a ring-opening catalyst;
(f) reacting in the presence of said ring opening catalyst molar amount of said donor compound with epoxide groups of the epoxide-containing copolymer chain, said molar amount of said donor compound consuming between about 25 to about 75 percent of said epoxide groups in said epoxide-containing copolymer chain; and
(g) thereby forming an ethylenically unsaturated an acryglycidyl copolymer having remaining reactive epoxide groups, said reactive epoxide groups being capable of subsequent cationic reaction.

15. The method of claim 14 in which the source of monomer in step (b) is selected from the group consisting of:
methyl methacrylate, butyl acrylate, hydroxyethylacrylate, methyl acrylate, ethyl acrylate, isopropyl acrylate, n-butyl acrylate, s-butyl acrylate, t-butyl acrylate, 2-ethylhexyl acrylate, cyclohexyl acrylate, 3,3,5-trimethycyclohexyl acrylate, 2-methoxyethyl acrylate, 2-ethoxyethyl acrylate, 2-butoxyethyl acrylate, acrylonitrile, methyl methacrylate, ethyl methacrylate, isopropyl methacrylate, n-butyl methacrylate, s-butyl methacrylate, t-butyl methacrylate, n-hexyl methacrylate, n-octyl methacrylate, lauryl methacrylate, tridecyl methaciylate, stearyl methacrylate, phenyl methacrylate, cyclohexyl methacrylate, 3,3,5-trimethylcyclohexyl methacrylate, isobornyl methacrylate, bromoethyl methacrylate, 2-hydroxyethyl methacrylate, hydroxypropyl methacrylate, methoxyethyl methacrylate, ethoxyethyl methacrylate, diethyl methyleneglutarate, isocyanatoethyl methacrylate, methacrylonitrile, 2-(diethylphosphato)ethyl methacrylate, 1-diethylphosphonoethyl methacrylate, ethylene, butadiene, vinylidene chloride, acrylic acid, methacrylic acid, itaconic acid, fumaric acid, and n-vinylpyrrolidinone.

16. The method of claim 14 in which the polymer is capable of curing by photopolymerization or cationic polymerization or a combination of each.

17. The method of claim 14 in which the catalyst is a free radical catalyst having a half life less than about 30 minutes at 120 degrees C.

18. The method of claim 17 in which the catalyst employed in step (e) comprises a phosphonium or onium compound.

19. The method of claim 14 in which the glass transition temperature of the copolymer is less than about 60 degrees C.

20. The method of claim 14 in which the forming step comprises curing the copolymer without adding heat.

21. The method of claim 14 in which the epoxide-containing acrylate monomer employed in step (a) comprises glycidyl methacrylate.

22. An ethylenically unsaturated copolymer formed by a process comprising:
(a) providing an epoxide-containing ethylenically unsaturated monomer having at least one epoxide group;
(b) providing an ethylenically unsaturated monomer, the monomer being selected from the group of monomers consisting of:
methyl methacrylate, butyl acrylate, hydroxyethylacrylate, methyl acrylate, ethyl acrylate, isopropyl acrylate, n-butyl acrylate, s-butyl acrylate, t-butyl acrylate, 2-ethylhexyl acrylate, cyclohexyl acrylate, 3,3,5-trimethycyclohexyl acrylate, 2-methoxyethyl acrylate, 2-ethoxyethyl acrylate, 2-butoxyethyl acrylate, acrylonitrile, methyl methacrylate, ethyl methacrylate, isopropyl methacrylate, n-butyl methacrylate, s-butyl methacrylate, t-butyl methacrylate, n-hexyl methacrylate, n-octyl methacrylate, lauryl methacrylate, tridecyl methacrylate, stearyl methacrylate, phenyl methacrylate, cyclohexyl methacrylate, 3,3,5-trimethylcyclohexyl methacrylate, isobornyl methacrylate, bromoethyl methacrylate, 2-hydroxyethyl methacrylate, hydroxypropyl methacrylate, methoxyethyl methacrylate, ethoxyethyl methacrylate, diethyl methyleneglutarate, isocyanatoethyl methacrylate, methacrylonitrile, 2-(diethylphosphato)ethyl methacrylate, 1-diethylphosphonoethyl metacrylate, ethylene, butadiene, vinylidene chloride, acrylic acid, methacrylic acid, itaconic acid, fumaric acid, and n-vinylpyrrolidinone;
(c) reacting (a) with (b), thereby forming an epoxide-containing copolymer chain, the epoxide-containing copolymer chain having epoxide groups positioned along said chain;
(d) providing a donor compound, said donor compound being selected from the group consisting of: ethylenically unsaturated acids and anhydrides;
(e) providing a ring-opening catalyst;
(f) reacting in the presence of said ring-opening catalyst said donor compound with epoxide group(s) of the epoxide-containing copolymer chain, said donor compound consuming between about 25 and about 75 percent of said epoxide groups in said epoxide-containing copolymer chain; and
(g) forming an ethylenically unsaturated glycidyl copolymer having reactive epoxide groups.

23. The acrylate copolymer of claim 22 wherein the epoxide-containing acrylate monomer employed in step (a) comprises glycidyl methacrylate.

24. The acrylate copolymer of claim 22 wherein said monomer employed in step (b) comprises butyl acrylate.

25. The acrylate copolymer of claim 22 wherein said monomer employed in step (b) comprises methyl methacrylate.

26. The acrylate copolymer of claim 22 wherein said monomer employed in step (b) comprises hydroxyethyl acrylate.

27. The acrylate copolymer of claim 22 wherein said monomer employed in step (b) comprises hydroxyethyl acrylate.

28. The acrylate copolymer of claim 22 wherein the epoxide-containing acrylate monomer comprises about 15 to about 35% of said copolymer by weight.

29. The acrylate copolymer of claim 22 wherein the monomer provided in step (b) comprises between about 65–85% by weight of said copolymer.

30. The acrylate copolymer of claim 22 wherein the process for producing said copolymer further comprises solution polymerization in a true solvent below the boiling point of said solvent.

31. The acrylate copolymer of claim 30 wherein during the reacting step (c), the temperature employed is less than the boiling points of:

(i) said epoxide-containing acrylate monomer of step (a) and
(ii) said monomer provided in step (b), and
(iii) said solvent.

32. The acrylate copolymer of claim 22 wherein the process employs a reaction in step (c) that occurs at a temperature below the boiling point of said monomer provided in step (b).

* * * * *